United States Patent [19]

Jou et al.

[11] Patent Number: 4,768,196
[45] Date of Patent: Aug. 30, 1988

[54] PROGRAMMABLE LOGIC ARRAY

[75] Inventors: Jing-Yang Jou, Scotch Plains, N.J.; Christopher Rosebrugh, Belmont, Mass.

[73] Assignee: Silc Technologies, Inc., Burlington, Mass.

[21] Appl. No.: 923,984

[22] Filed: Oct. 28, 1986

[51] Int. Cl.[4] .................... G01R 31/02; G01R 31/28
[52] U.S. Cl. ........................................ 371/25; 371/26
[58] Field of Search ................ 324/73 R; 371/21, 25, 371/26

[56] References Cited

U.S. PATENT DOCUMENTS

| | | | |
|---|---|---|---|
| 4,291,386 | 9/1981 | Bass | 364/717 |
| 4,366,393 | 12/1982 | Kasuya | 371/15 |
| 4,418,410 | 11/1983 | Goetze et al. | 371/15 |
| 4,498,172 | 2/1985 | Bhavsar | 371/15 |
| 4,503,387 | 3/1985 | Rutledge et al. | 324/73 R |
| 4,597,080 | 6/1986 | Thatte et al. | 371/25 |

OTHER PUBLICATIONS

"Built-In Tests for VLSI Finite-State Machines", by Hua et al., Proceedings FTCS-14, 1/83.
"Testing PLAs using Multiple Parallel Signature Analyzers by Hassan et al., Proceedings FTCS-13, pp. 422-425, 11/83.
"Hardware Approach to Self-Testing of Large Programmable Logic Arrays", by Daehn et al., IEEE Trans. on Comp., vol. C-30, #11, 11/81, pp. 829-833.
"Implementing a Built-In Self-Test PLA Design", by Treuer et al., IEEE Des. & Test of Computers, 4/85, pp. 37-48.
"Circuit Synthesis for the Silc Silicon Compiler", by Rosebrugh et al., IEEE Custom Integ. Circ. Conf., pp. 384-388, 6/85.
"Platypus: A PLA Test Pattern Generation Tool", by Wei et al., IEEE 22nd Design Autom. Confer., paper 14.2, pp. 197-203, 6/85.
"Detection of Faults in Programmable Logic Arrays", by Smith, IEEE Trans. on Comp., vol. C-28, #11, 11/79, pp. 845-853.

Primary Examiner—Reinhard J. Eisenzopf
Assistant Examiner—W. Burns
Attorney, Agent, or Firm—Wolf, Greenfield & Sacks

[57] ABSTRACT

Built-in self-test programmable logic arrays use a deterministic test pattern generator to generate test patterns such that each cross point in an AND-plane can be evaulated sequentially. A multiple input signature register which uses $X^Q+1$ as its characteristic polynomial is used to evaulate the test results, where Q is the number of outputs. The final signature can be further compressed into only one bit. Instead of only determining the probability of fault detection, in this scheme, the fault detection capability has been analyzed using both the stuck at fault and the contact fault model. It can be shown that all of these faults can be detected. Shorts between two adjacent lines can be detected by using NOR gates.

4 Claims, 7 Drawing Sheets

PROGRAMMABLE LOGIC ARRAY

BACKGROUND OF THE INVENTION

1. Field of the Invention

This invention relates to built-in self-test programmable logic arrays. Accordingly, it is a general object of this invention to provide new and improved arrays of such character.

2. General Background

The introduction of LSI/VLSI technology (i.e., large scale integration/very large scale integration) has increased the difficulty of both the designing and the testing of complex systems which can be implemented on a semiconductor chip. The programmable nature of programmable logic arrays (PLA) makes the design task much easier. A small complex system, an IBM 7441 Buffered Terminal Control Unit using PLAs, is described by J. C. Logue, N. F. Brickman, F. Howley, J. W. Jones, and W. W. Wu, "Hardware Implementation of a Small System in Programmable Logic Arrays", *IBM J. Research Development*, pp. 110–119, March 1975, which suggests that the PLA approach exploits many of the benefits of LSI/VLSI without high engineering design cost. Due to the regular structure, PLA implementation of both combinational circuits and finite state machines can be easily automated. For example, in GTE Corporation's SILC (tm) silicon compiler, PLAs with feedback paths are used to implement the control logic for each generalized finite state machine, as reported by C. P. Rosebrugh and J. H. Vellenga, "Circuit Synthesis for the Silc Silicon Compiler", *IEEE 1985 Custom Integrated Circuits Conference*, pp. 384–388, May 1985. In addition to making circuit design easier, due to the array-oriented structures, the PLA approach for LSI/VLSI also simplifies the testing problem.

A review of the following papers,

D. L. Ostapko and S. J. Hong, "Fault Analysis and Test Generation for PLAs", *IEEE Transactions on Computers*, Vol. C-28, September 1979, J. E. Smith, "Detection of Faults in PLAs", *IEEE Transactions on Computers*. Vol. C-28, November 1979, Pradis Bose and J. A. Abraham, "Functional Testing of PLAs", 19th *Design Automation Conference*, August 1982, and R.-S. Wei and A. Sangiovanni-Vincentelli, "PLATYPUS: A PLA Test Pattern Generation Tool", 22nd *D.A. Conference*, June 1985, indicates that much effort has been directed to the problem of fault detection in the PLAs in recent years. However, the testing of large PLAs is difficult. Pseudorandom number sequences as discussed by D. K. Bhavsar and R. W. Heckelman, "Self-testing by Polynomial Division", *Proceedings of the IEEE International Test Conference*, pp. 208–216, 1981, are attractive in many testing problems; unfortunately, they are not an effective approach for PLA testing due to the high fan-in in PLAs, as indicated by T. W. Williams and K. P. Porker, "Design for Testability: A Survey", *IEEE Transactions on Computers*, Vol, C-31, No. 1, pp. 2–15, January 1982. Due to the structural regularity of PLAs, this test problem has attracted tremendous attention in recent years. In particular, the design of built-in self-test (BIST) PLAs with low overhead and high fault coverage appears to be a possible solution to the testing problem.

Under the BIST approach, the logic required to generate tests for a circuit, and the logic required for analysis of the circuit's response to those tests, are implemented in hardware residing within the same system as the circuit under test. Thus, the circuit is capable of testing itself and reporting to its environment whether it is a working circuit or not.

Various built-in self-test programmable logic arrays (BIST PLAs) have been discussed in the literature, including K. A. Hua, J.-Y. Jou, and J. A. Abraham, "Built-In Tests for VLSI Finite-State Machine", *Proceedings FTCS*-14;

R. Treuer, H. Fujiwara, and V. K. Agarwal, "Implementing a Built-in Self-Test PLA Design", *IEEE Design and Test of Computers*, April 1985;

S. Z. Hassan and E. J. McCluskey, "Testing PLAs Using Multiple Parallel Signature Analyzers", *Proceedings FTCS*-13; and W. Daehn and J. Mucha, "A Hardware Approach to Self-Testing of Large Programmable Logic Arrays", *IEEE Transactions on Computers*, Vol. C-30, November, 1981, pp. 829–833.

These literature suggestions offer different degrees of testability, have different properties, require different hardware overhead, and have different degrees of performance impact due to additional circuitry. BIST designs are clearly a worthwhile approach, but like many other design decisions, involve tradeoffs and are not inexpensive.

The most critical requirement for designing a BIST PLA is that the test patterns used to test the PLA should be simple, that only a mere modification or augmentation of an existing circuit would serve as a test pattern generator in a testing mode. That is, the overhead for test logic should be kept as small as possible. The size of test patterns should be small so that the test pattern can be quickly generated. An output response should be compressible into a small number of bits. The technique used for data compression should have several attributes. It must be simple enough for implementation as part of a BIST scheme to reduce overhead. It must be fast enough to remove it as a limiting factor in testing-time. It must not lose the error information contained in the output response stream of a faulty PLA. Following, four prior art BIST PLA designs are discussed. The advantage and disadvantage of each design in terms of hardware overhead, numbers of test patterns, and delay per test applications are also discussed.

REVIEW OF BIST PLA DESIGNS OF THE PRIOR ART

Figure 1:
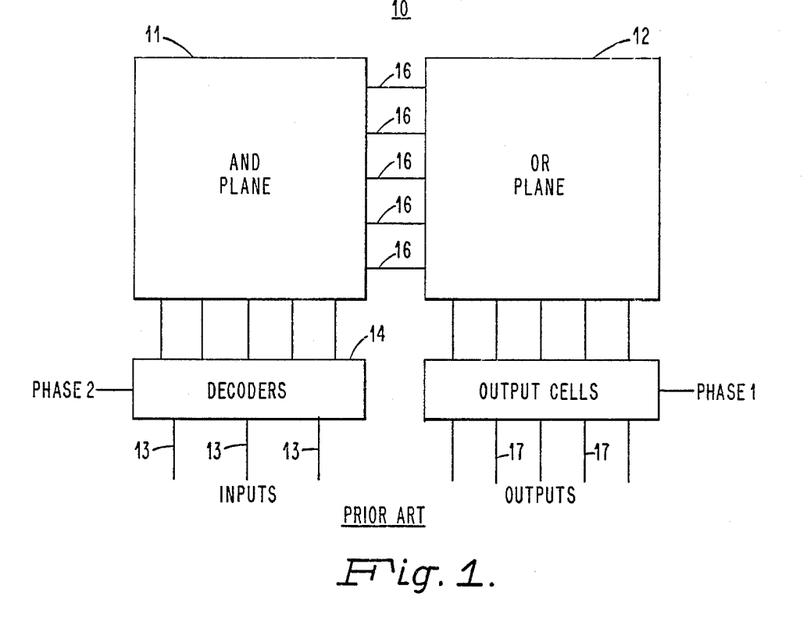
FIG. 1 is a block diagram of a programmable logic array of the prior art.

A PLA 10 consists of an AND plane 11 and an OR plane 12, as shown in FIG. 1. The inputs 13—13 that are trapped during phase 2 in the decoders 14 are run vertically through the AND plane 11. The outputs 16—16 of the AND plane 11, called the product lines, are oriented at right angles to the inputs 13—13 and run horizontally through the OR plane 12. Outputs 17—17 of the OR plane 12 then run vertically and are sent out during phase 1. The planes 11, 12 can be realized as NOR arrays in dynamic CMOS technology suggested by C. P. Rosebrugh, "Notes on Silc's Dynamic CMOS Circuit Methodology", Silc TM User Notes #12, July 24, 1985.

Routing of signals often requires more silicon area than the components. Thus, any calculations made to estimate the overhead without considering the routing area are often too optimistic. Hua, Jou, and Abraham, supra, have indicated that a large number of alleged easily testable PLA designs are not suitable candidates for BIST PLAs unless proper estimates are obtained. A structure of a finite state machine with BIST was proposed by Hua et al. and shown therein. An extra product line and an extra output line were added to the AND and OR arrays, respectively, to assure fault coverage. Two control signals were used for the selection of different operational modes. Normally, with control signals, an augmented decoder functions as a normal single-bit decoder. With certain conditions, the augmented decoder functions as a test pattern generator for the testing of the AND plane. A NOR gate output, together with a parity checker are used for test evaluation when the AND plane is under test. A test pattern generator generates the test sequence for the OR plane under certain conditions. Two parity checkers are used for test response evaluations when the OR plane is under test.

This prior art system covers any single fault in the naked PLA, or the test logic, that is of the following types:
1. Short between two adjacent lines.
2. Stuck-at fault.
3. Contact fault due to a missing device at the cross-point, or an extra device at the cross-point where there should not be one.

Although this system assumes a single fault model for simplicity, most of the multiple stuck-at faults and short faults of the PLA lines are also detected using this system.

The number of test patterns therein is $(2m+P+2)$, where M is the number of inputs and P is the number of product lines. The overhead for a typical large size PLA with 32 inputs, 18 feedback paths, 190 product lines and 49 outputs is 20%.

The delay per test is an important parameter for the evaluation of a BIST design. Based on the assumption proposed by Hassan and McCluskey, supra, that the input decoders, the AND array, and the OR array each has one gate delay, each exclusive-OR gate is assumed to have two gate delays. It may take time to count the parities of product lines and outputs because of long cascaded exclusive-OR gates. For instance, a parity checker on P product lines of a PLA results in a test delay of 2P units. The delay per test application, thus, is a shortcoming of this scheme.

Treuer, Fujiwara, and Agarwal proposed a similar scheme, supra, in which they trade the number of test patterns to one parity checker. That is, they delete one parity checker of product lines and increase the number of test patterns to $(2MP+2M+1)$. The shortcoming in delay per test remains. The overhead is slightly less than the Hua et al. scheme; 15% overhead has been reported for the same example.

Hassan and McCluskey, supra, proposed an exhaustive testing scheme using signature analyzers for testing PLAs, in which additional hardware consists of several linear-feedback shift registers (LFSRs). An M-bit LFSR generates exhaustive pseudorandom test patterns. Two parallel input LFSRs compress the resulting values on the true bit lines and the complemented bit lines, respectively. Finally, another parallel input LFSR compresses the output response on the lines. The LFSR at the input lines is run through its maximal length of $2^M-1$. Thus, this scheme is only applicable for PLAs with a small number of input lines in terms of the number of test patterns. The overhead of this scheme becomes very large unless the number of product lines is very large compared to the number of input lines. The overhead and the number of test patterns are disappointing in this scheme. However, the delay per test is better than the two previous schemes, since signature analysis instead of parity checking is used.

Daehn and Mucha, supra, proposed the use of nonlinear feedback shift registers both as pattern generators and as the output response compressors for BIST PLA design. Three slightly modified forms of built-in logic block observer are required in this scheme in which the number of test patterns is $2+P+Q+1$, where Q is the number of outputs. The fault coverage is claimed to be 100 percent, the delay per test, good. However, its overhead is limited by the three modified logic block observers, which occupy a reasonably large area.

SUMMARY OF THE INVENTION

Another object of this invention is to provide for a new and improved built-in self-test programmable logic array in which each cross-point in the AND-plane can be sequentially evaluated.

Still another object of this invention is to provide for a new and improved built-in self-test programmable logic array which is inexpensive and high in performance.

In accordance with an aspect of the invention, a programmable logic array having built-in self-testing capability is capable of operating in a normal mode and a test mode. It includes an array of input lines coupled with decoding circuits. The decoding circuits are coupled, via bit lines, with an AND array that is coupled via product lines with an OR array. The OR array is provided with output lines in which the aggregate of signals thereacross at an instant of time is an output signature. Control signal receiver means receive a plurality of control signals from an external source. The control signals include a normal mode signal, a test mode signal, and a clock signal. Bit-line test-pattern generation means are coupled with the bit lines and the control signal receiver means, and responsive to the control signals, for generating a first predetermined sequence of test patterns across the bit lines, when in the test mode, in synchronization with the clock signal. Product-line test-pattern generation means are coupled with the product lines and the control signal receiver means, and responsive to the control signals, for generating a second predetermined sequence of test patterns across the product lines when in the test mode in synchronization with the clock signal. Multiple output signature compression means are coupled with the output lines and the control signal receiver means and responsive to the control signals, for compressing the sequence of output signatures occurring in the test mode into a single-bit test result and for passing through unaltered any output signature occurring in the normal mode. The multiple output signature compression means has $X^Q+1$ as its characteristic polynomial, where Q is the number of the output lines and X is a dummy variable. The multiple output signature compression means are so coupled for transmitting the single-bit test result to an external receiver. At least one programmable logic array output line is coupled with the multiple output signature compression means.

BRIEF DESCRIPTION OF THE DRAWING

Other objects, advantages, and features of this invention, together with its construction and mode of operation, will become more apparent from the following description, when read in conjunction with the accompanying drawings, in which.

DESCRIPTION OF THE PREFERRED EMBODIMENT(S)

Figure 2:
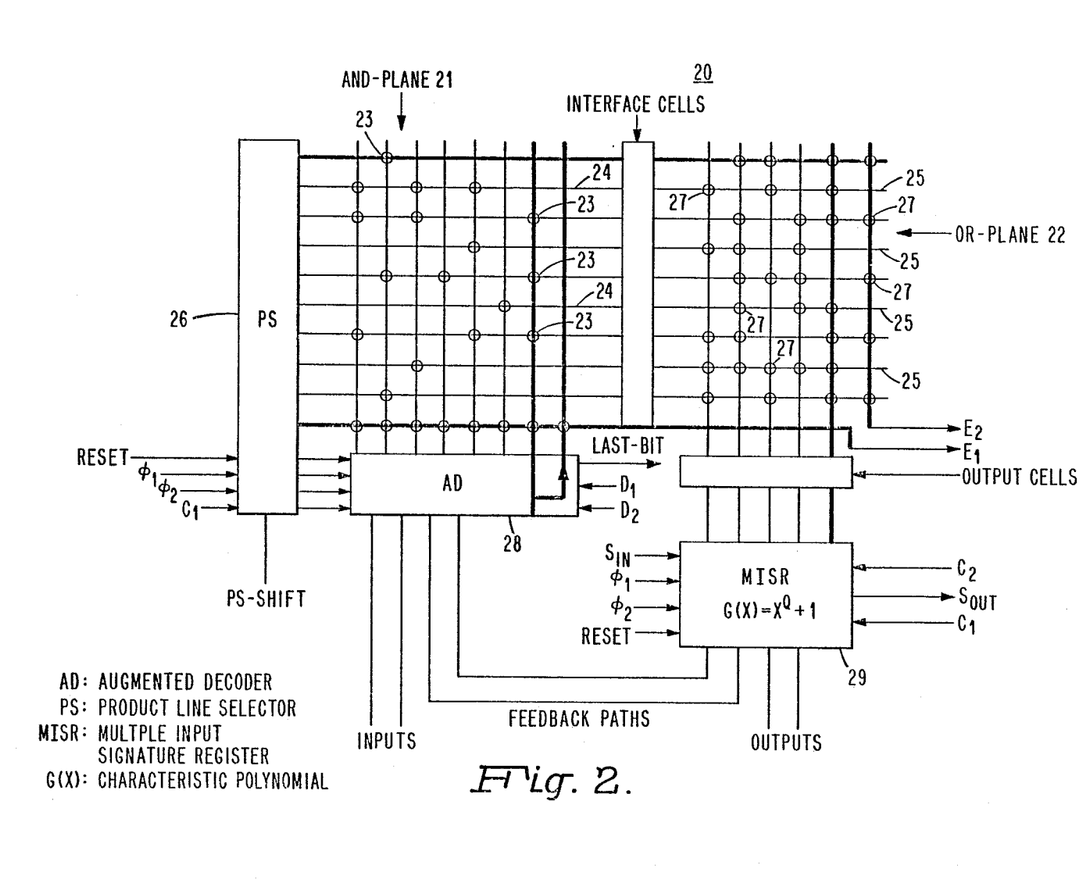
FIG. 2 is a block diagram of a built-in self-test programmable logic array in accordance with one embodiment of the invention.

A built-in self-test programmable logic array 20 is depicted in FIG. 2. An extra input, one or two extra product lines and an extra output are added to the AND and OR arrays, 21, 22 respectively (darker lines). The devices 23—23 on the extra input are arranged so that each of the rows 24—24 (product lines) of the AND plane 21 has an odd number of devices. Either no device or one device on the uncomplement bit lines of the extra input is added. In other words, the devices 23—23 are put only on the uncomplement bit line of the extra input if necessary. In this manner, the extra input can be set to 0 in the normal operation. The first extra product line is pulled down by product line selector 26 (PS) in normal operation. The devices 23—23 on the first extra product line are arranged so as to cause each of the bit lines of the AND array 21 to have an odd number of devices, and each output in the OR plane has an odd number of devices 23—23. The only exception is that there is no device on the complement bit line of the extra input. Before adding the first extra product line, another second extra product line should be added when there are a totally odd number of product lines in the original PLA. That is, it is desired to have BIST PLAs with an odd number of product lines. The devices 23—23 on this second extra product line are arranged such that there is solely one device 23 on the intersection of this second extra product line and the uncomplement bit line of the extra input in the AND array 21, and there is solely one device 23 on the intersection of this extra product line and the extra output in the OR array 20. The devices on the extra output are arranged so as to cause each of the rows 25—25 of the OR plane 22 to have an odd number of devices 27—27. Two NOR gates E1 and E2 are added to detect bridging faults between two adjacent bit lines and product lines. The NOR gate E1 has devices 23—23 on every bit line. The NOR gate E2 has devices 27—27 on every other product line.

Figure 3A:
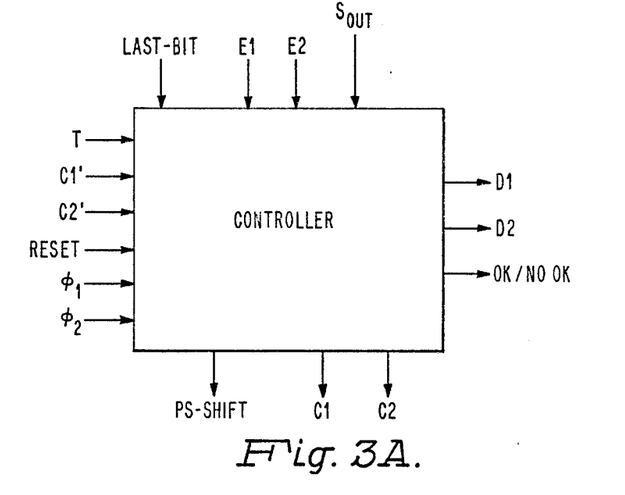
FIG. 3A is a block diagram of a controller, useful in accordance with an aspect of the invention.
Figure 3B:
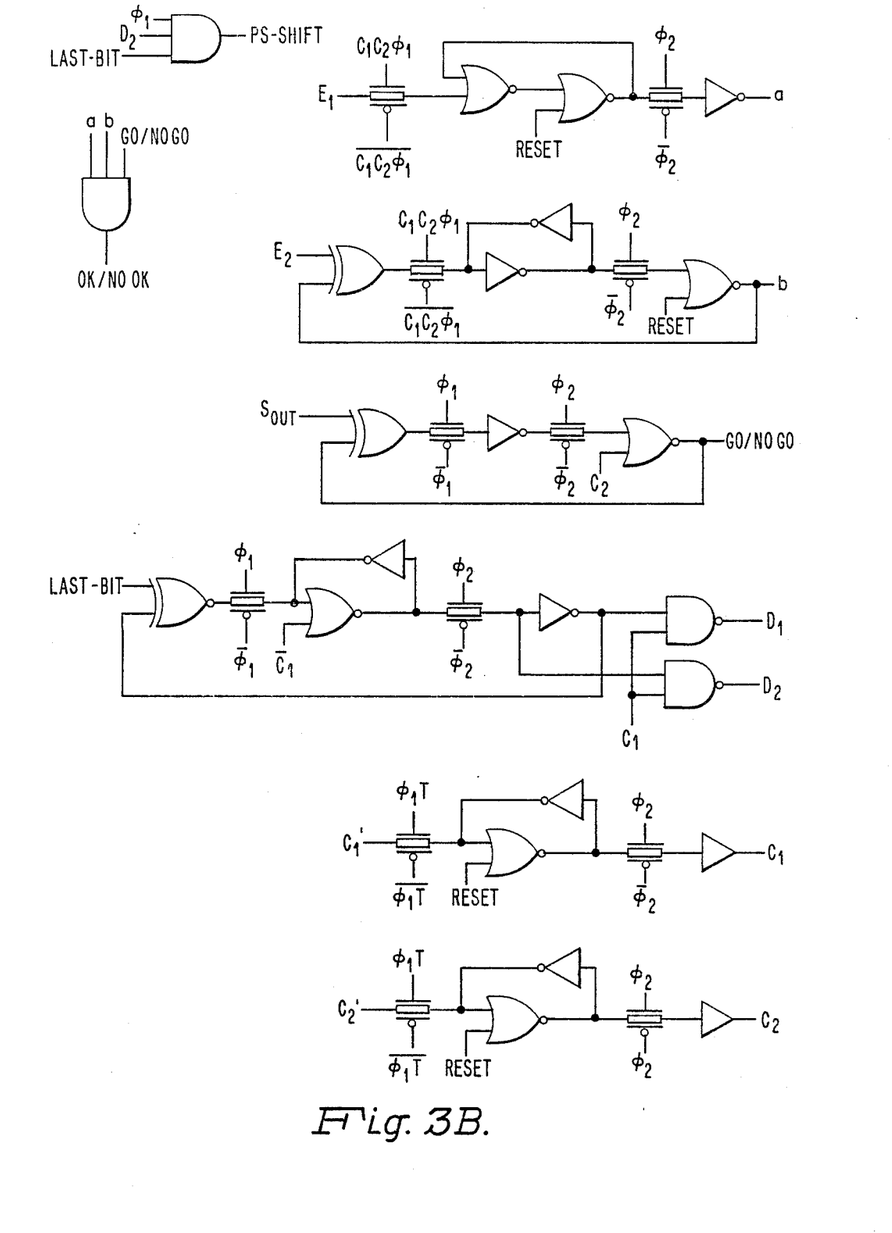
FIG. 3B is a logic diagram of the controller shown in FIG. 3A.

A local controller is shown in block and logic form in FIGS. 3A and 3B, respectively. Four signals communicate between the local controller and the chip test controller. When C1=C2=1, the augmented decoder 28 and product line selector 26 serve as the test pattern generator and multiple input signature register 29 (MISR) as the signature analyzer. The product line selector 26 (PS) is added and the input decoder is modified such that, in the testing mode (C1=C2=1), each cross point between input bit lines of the AND plane and the product lines is tested one after another. The block diagrams and logic diagrams of an augmented decoder 28 AD, a product line decoder 26 PS and a slightly modified multiple input signature register 29 (MISR) are shown in FIGS. 4A, 4B, 5A, 5B, 6A and 6B, respectively.

Figure 4A:
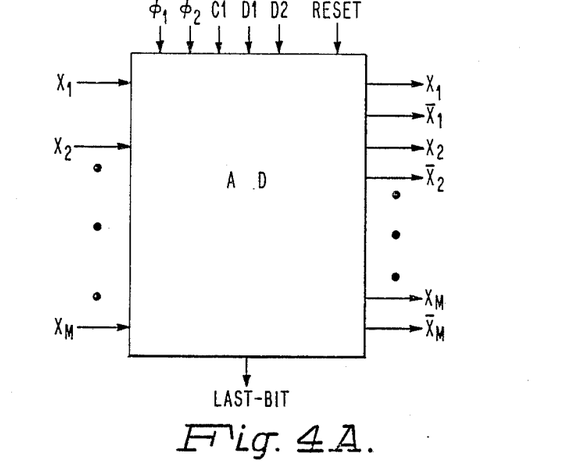
FIG. 4A is a block diagram of an augmented decoder, useful in accordance with some aspect of the invention.
Figure 4B:
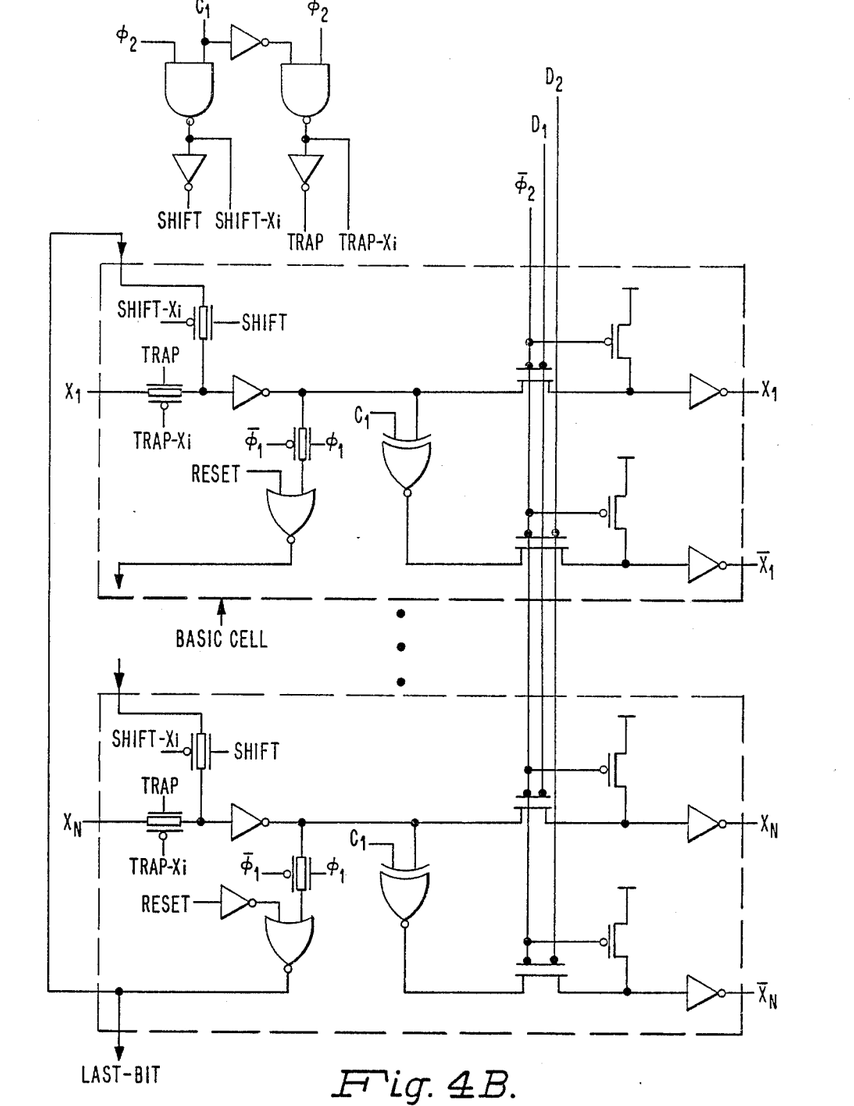
FIG. 4B is a logic diagram of the augmented decoder shown in FIG. 4A.
Figure 5A:
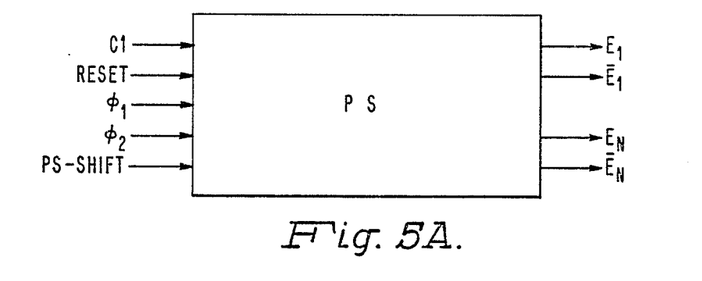
FIG. 5A is a block diagram of a product line selector, useful in accordance with another aspect of the invention.
Figure 5B:
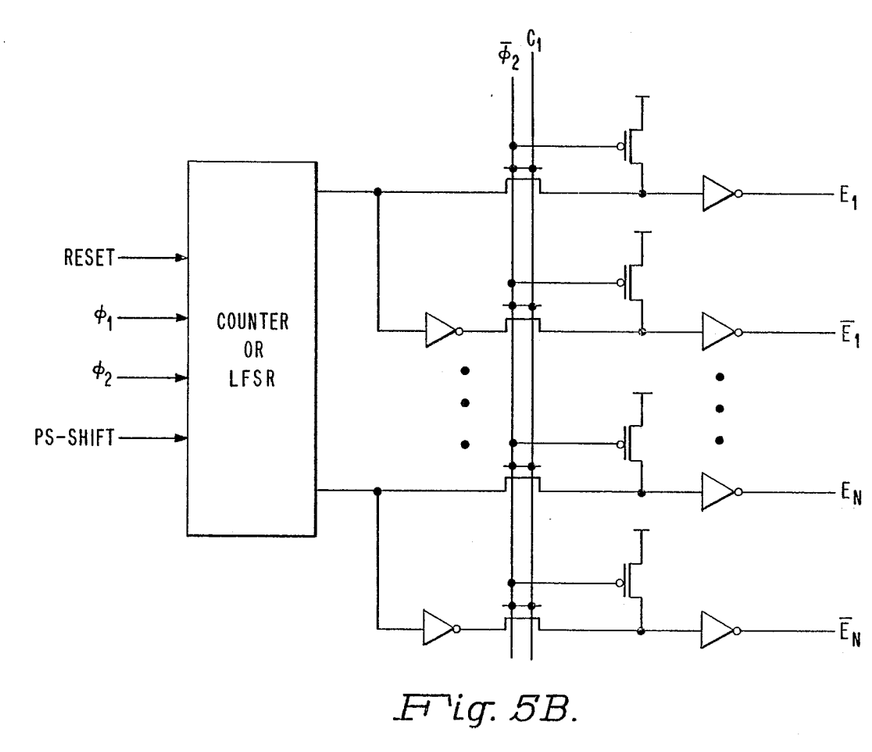
FIG. 5B is a logic diagram of the product line selector shown in FIG. 5A.

In the product line selector 26, a decoding scheme is used such that each product line can be selected by one state of the counter or linear feedback shift register. As also shown in Konemann, B., Mucha, J., and Zwiehoff, G., "Built-in Logic Block Observation Techniques", 1979 *International Test Conference,* Cherry Hill, N.J., October 1979, pp. 37–41, this PS design is cost-effective because there is no interconnection problem between the very compact PLA cells and the PS. In the augmented decoder (AD), a multiplexing scheme is used such that two bit lines share one stage of shift register in testing mode. The original input decoders, implemented by using precharged dynamic CMOS technology, consist of 13 transistors and are much larger than those implemented by using NMOS technology. Each augmented decoder 28 consists of 21 transistors. It is much easier to design the augmented decoders 28 to align perfectly with the PLA cells because of the original large sized input decoders. The overhead of augmented decoders in dynamic CMOS implementation is, thus, relatively smaller than in NMOS implementation. A MISR which uses $X^Q+1$ as its characteristic polynomial is served as the parallel signature analyzer when C1=C2=1.

Figure 6A:
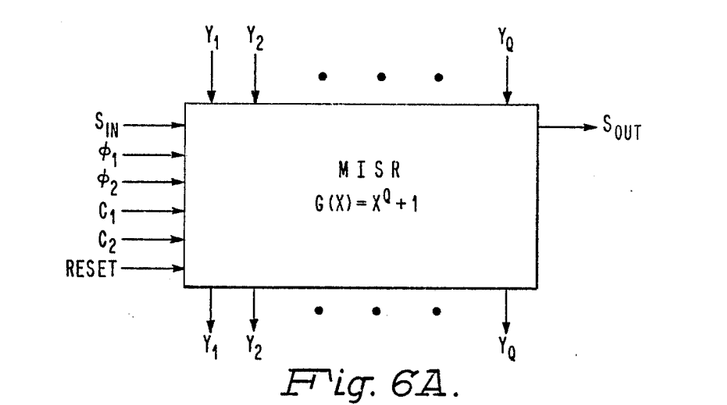
FIG. 6A is a block diagram of a multiple input signature register.
Figure 6B:
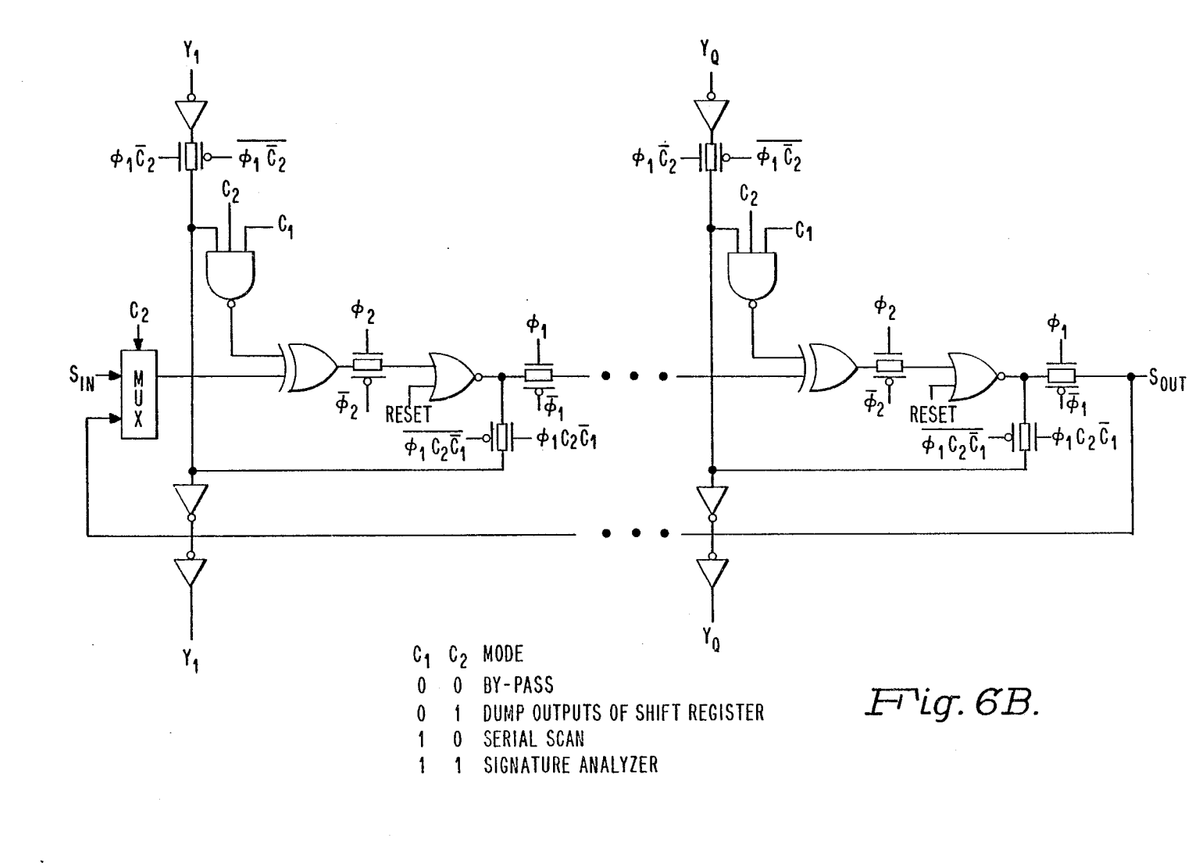
FIG. 6B is a logic diagram of the multiple input signature register shown in FIG. 6A.

Once the tests are completed, the control signals C1 and C2 are set to C1=1, C2=0, and the MISR serves as a shift register such that the test results are shifted out for further compression. A parity counter compresses the final signature into only ONE bit which should be 1 when the circuit is fault free. The logic diagram of the MISR and its different operational modes is shown in FIG. 6B. Since the PLA with feedback paths is usually used to implement the control logic in a VLSI chip, the outputs of the PLA continuously feed the data path logic. When C1=1 and C2=0, MISR operates as a shift register. Data are serially clocked into the register through the serial input $S_{in}$ while the register contents are simultaneously clocked out through a serial output $S_{out}$. Thus, MISRs serve as a part of a scan path. This feature simplifies the testing problem of data path logic.

Let us denote the test pattern for evaluating the crosspoint between the ith bit lines and jth product line as $t_{i,j}$. Then the test sequence will be $t_{1,1}\ t_{3,1} \ldots, t_{2m-1,1}\ t_{2,1} \ldots t_{2m,1}\ t_{1,2}\ t_{3,2} \ldots t_{2m,2} \ldots t_{2m,p}$. The order looks strange because of the multiplexing scheme. The number of test patterns generated under this approach is thus 2MP.

The designs and functions of the augmented decoder and the product line selector which serve as the test pattern generator are simpler than those of the prior art. Also, the simplest form of MISR which uses $X^Q+1$ as its characteristic polynomial and the parity checker have the same number of exclusive − OR gates for the same number of outputs. It is noted that a stuck-open fault problem does not exist in dynamic CMOS technology, as that in conventional CMOS technology. The fault detection capability of this invention is analyzed, employing stuck-at fault, bridging fault, and contact fault model, and is shown in the next section.

FAULT COVERAGE

Treat binary streams as polynomials in a dummy variable X: As an example, a 5-bit output sequence 11001 can be represented by the 4th degree polynomial: $S(X)=1+X+X^4$. This transformation of a bit pattern into a polynomial is for convenience, and permits a mathematical manipulation of the bit streams in polynomial form. Polynomial arithmetic is performed modulo 2, according to the rules of algebraic field theory, in which there are no carries for addition or borrows for subtraction. Both addition and subtraction are identical to exclusive OR. Assume the PLA has Q outputs. Let $R_i(X)$ be the (Q−1)th degree polynomial representing the test response on the Q outputs of the PLA during test cycle i. Let $S_i(X)$ be the polynomial defining the cumulative state of the Q outputs of the MISR during test cycle i. Then, the next state of the MISR (after test cycle i) is:

$$S_{i+1}(X)=(R_i(X)+X\,S_i(X)) \bmod G(X).$$

$A(X)=B(X) \bmod G(X)$ means that $A(X)$ is the remainder when $B(X)$ is divided by $G(X)$. For example, suppose $G(X)=1+X^5$. If $S_i(X)=1+X+X^2+X^4=11101$ and $R_i(X)=X+X^2=01100$, then, $S_{i+1}(X)=(X+X^2+X(1+X+X^2+X^4)) \bmod 1+X^5=1+X^3=10010$.

Let $E_i(X)$ be the error polynomial indicating the incorrect outputs of the PLA during test cycle i. Suppose the correct outputs of test cycle i is $X+X^4=01001$. If some error happens such that the outputs of test cycle i becomes $X^2+X^3=00110$, then $E_i(X)=(X^2+X^3)-(X+X^4)=X+X^2+X^3+X^4$. Let $F_i(X)=R_i(X)+E_i(X)$. Then, $F_i(X)$ is the real output polynomial under some error. The final state of the MISR, which is referred to as the "signature", is thus the final remainder after a sequence of w tests has been applied, where $w=2MP$. From the definition of congruence operation in module arithmetic, $(X+Y) \bmod G = (X \bmod G + Y \bmod G) \bmod G$, the signature is thus equal to Signature = $(F_w(X) + X( \ldots (F_2(X) + XF_1(X))$ mode $G(X))$ mod $G(X) \ldots)$ mode $G(X) = (R_w(X) + E_w(X) + X( \ldots ((R_2(X) + E_2(X)) + X(R_1(X) + E_1(X))$ mod $G(X))$ mod $G(X) \ldots)$ mod $G(X) = ((X^{w-1}R_1(X) + X^{w-2}R_2(X) + \ldots + XR_{w-1}(X) + R_w(X))$ mod $G(X) + (X^{w-1}E_1(X) + X^{w-2}E_2(X) + \ldots + XE_{w-1}(X) + E_w(X))$ mod $G(X))$ mod $G(X)$. Let us define $R(X) = X^{w-1}R_1(X) + X^{w-2}R_2(X) + \ldots + XR_{w-1}(X) + R_w(X)$ and $E(X) = X^{w-1}E_1(X) + X^{w-2}E_2(X) + \ldots + XE_{w-1}(X) + E_w(X)$.

If some errors, which are caused by some fault, occur, such that $E(X)$ mode $G(X)=0$, then this fault is undetectable by this MISR. Because:

Signature = $(R(X)$ mode $G(X) + E(X)$ mode $G(x))$ mode $G(X)$
= $R(X)$ mode $G(X)$
= good signature.

This is termed "aliasing"; an erroneous sequence from a faulty circuit maps into the good signature. Thus, a good testing scheme should make the possibility of aliasing as small as possible, including zero.

In order to guarantee detection of all modeled faults, it is necessary that the $E(X)$ caused by some fault satisfy the requirement of $E(X) \bmod G(X) \neq 0$, or $E(X)$ is not divisible by $G(X)$, where $G(X)=X^Q+1$ and Q is the number of PLA's outputs. It is impossible to have extra device fault in full custom design. The consideration of extra device fault is just for completeness of theory.

Theorem 1: $E(X) \bmod G(X) \neq 0$ if $E(X)$ has an odd number of terms and $G(X)=X^Q+1$.

Proof: Assume that $E(X)$ has an odd number of terms and is divisible by $X^Q+1$. Factor $E(X)$ into $(X^Q+1)B(X)$. Now evaluate $E(1=(1^Q+1)B(1)$. Since $1^Q=1$ and $1+1=0$ (Modular 2), $E(1)$ must be zero. If $E(X)$ has an odd number of terms, substituting 1 for X everywhere will always yield 1 as the result, which is a contradiction. Thus, no polynomial with an odd number of terms is divisible by $X^Q+1$. Q.E.D.

Q.E.D. which was to be demonstrated or proved (Latin quod erat demonstrandum).

If it can be proved that each single modeled fault always causes $E(X)$ with an odd number of terms, then from Theorem 1, it is known that 100% single fault coverage can be achieved using this scheme.

Define $P(f)=1$ if $E(X)$ caused by the fault f has an odd number of terms, otherwise $P(f)=0$.

Lemma 1: Any single missing device fault or extra device fault f in OR plane will cause $P(f)=1$.

Proof: Assume device d(i,j) on the intersection of product line j and output i is missing. $t_{k,j}(k=1, \ldots 2M)$ will propagate the errors through output i if there is not a device c(k,j) in the AND array, where device c(k,j) is at the intersection of bit line k and product line j. Since there is only an odd number of nondevices on the product line j in AND array, this fault will thus cause an odd number of (1-0) transitions at output i. Thus, $E(x)$ will have an odd number of terms. Similarly, if there is an extra device d(i,j), then this fault will cause an odd number of (0-1) transition at output i. Thus, $E(X)$ has an odd number of terms. Q.E.D.

Lemma 2: Any single missing device fault or extra device fault f in AND plane will cause $P(f)=1$.

Proof: Assume device c(i,j) on the intersection of ith input bit line and jth product line is missing. Since $t_{i,j}$ will evaluate this device and there is an odd number of devices in the jth product line on the OR plane, this fault will thus cause an odd number of (0-1) transitions during the application of $t_{i,j}$. Thus, $E(X)$ will have an odd number of terms. Similarly, if there is an extra device c(i,j) where there should not be one, then this fault will cause an odd number of (1-0) transitions. Thus, $E(X)$ has an odd number of terms. Q.E.D.

Lemma 3: Any single output stuck at 1 or stuck at 0 fault f will cause $P(f)=1$.

Proof: Assume output i stuck at 1. If device d(i,j) on the intersection of output i and product line j exists, then $t_{k,j}(k=1 \ldots 2M)$ will cause a (0-1) transition at output i if device c(k,j) exists, since there is an odd number of devices on each product line in the AND array and there is an odd number of devices in each output on the OR array. Since odd X odd=odd, this output stuck at 1 fault will cause output i to have an odd number of (0-1) transitions. If device d(i,j) does not exist, then $t_{k,j}(k=1 \ldots 2M)$ will always cause (0-1) transition. Since there is an even number of nondevices on each output, this will cause another even number of (0-1) transitions. However, this fault totally causes an odd number of (0-1) transitions because odd X odd+even X even =odd. In other words, the E(X) will have an odd number of terms. Similarly, since there is an odd number of nondevices in each product line and there is an odd number of devices in each output on the OR array, the output i stuck at 0 fault will cause output i to have an odd number of (1-0) transitions. Q.E.D.

Lemma 4: Any single product line stuck at 0 or stuck at 1 fault f will cause P(f)=1.

Proof: There is an odd number of nondevices in each product line. Product lines stuck at 0 fault can be modeled as having extra devices for all the nondevices on the faulty product line in the AND array. Since odd X odd=odd this fault will cause an odd number of (1-0) transitions on the outputs. Product line stuck at 1 fault can be modeled as an odd number of output stuck-at 1 fault. From Lemma 3, this fault will thus cause an odd number of (0-1) transitions on the outputs. In other words, the E(X) will have an odd number of terms. So P(F)=1 Q.E.D.

Lemma 5: Any single bit line stuck-at 0 or stuck at 1 fault f will cause p(f)=1.

Proof: Since there is an odd number of devices on each bit line, assume ith bit line is stuck at 0. $t_{i,k}$ (k=1, ..., P) will sensitize this fault if there is a device c(i,k). Since there is an odd number of devices on its bit lines and odd X odd=odd, it will cause an odd number of (0-1) transitions on the outputs. Similarly, assume ith bit line stuck at 1, $t_{j,k}$ (j=1, ..., 2M and j≠1, and k=1, ..., P) causes (1-0) transitions when there is a device c(i,k) and there is not a device c(j,k). Since there is an odd number of $t_{j,k}$ satisfying the requirements, the E(X) has an odd number of terms. Q.E.D.

The stuck-at fault of the last bit line will not be detected because, both no device is located there, and is otherwise unused.

Theorem 2: All the single contact faults and stuck-at faults can be detected by using this scheme.

Proof: From Lemmas 1 to 5, it can be concluded that all the modeled single stuck-at faults and contact faults can be detected.

Theorem 3: R(X) mod G(X) has an odd number of terms if R(X) has an odd number of terms and $G(X)=X^Q+1$.

Proof: Assume that R(X) has an odd number of terms and R(X) mod G(X) has an even number of terms.

Factor R(X) into $(X^Q+1)B(X)+R(X)$ mod G(X).

Now evaluate $R(1)=(1^Q+1)B(1)+R(1)$ mod G(1).

Since $1^Q+1=0$, and R(1) mod G(1)=0 (R(X) mod G(X) has an even number of terms), R(1) must be zero. But R(X) has an odd number of terms: substituting 1 for X at each occasion always yields a 1 as the result, which is a contradiction. Thus, no polynomial with an odd number of terms has a remainder with an even number of terms when it is divided by $X^Q+1$. Q.E.D.

Corollary 1: F(X) mod G(X) has an even number of terms if F(X) has an even number of terms and $G(X)=X^Q+1$.

In this design, there is totally an odd number of product lines. Each product line has an odd number of nondevices in the AND array and an odd number of devices in the OR array. Thus, in the fault-free situation where R(X) will have an odd number of terms, the parity of the final signature R(X) mod G(X) will be 1 according to Theorem 3.

If some fault causes an E(X) with an odd number of terms, then the real outputs polynomial, F(X)=E(X)+R(X), will have an even number of terms. The parity of the final signature, F(X) mod G(X), will be 0 according to Corollary 1. We thus conclude that the final signature can be further compressed into only single bit by a parity counter as shown in FIG. 3B (signal GO/NO GO). A fault free PLA will have a 1 as the final one-bit signature. A faulty PLA will have a 0 as the final one-bit signature.

Theorem 4: Any short faults between two adjacent product lines can be detected by NOR gates E2 combined with a parity counter.

Proof: Without loss of generalities, assume that product lines i and (i+1) short, and assume that there is a device at the intersection of product line i and NOR gate E2, but there is no device at the intersection of product line (i+1) and NOR gate E2 as shown in FIG. 2. $t_{k,i}$(k=1, ..., 2M) will cause a (0-1) transition on the output of E2 if there is not a device c(k,i). Since there is an odd number of nondevices on each product line in AND array, there is an odd number of (0-1) transitions on the output of E2. The NOR gate E2 combined with a parity counter will thus detect this short fault. Q.E.D.

As there is a totally odd number of product lines (including the extra product lines), the self-timed clock line failure to block all the signals from AND plane to OR plane causes an odd number of (1-0) transitions on the outputs that can be detected by this scheme.

Short faults between two adjacent bit lines can be detected by the NOR gate E1. Short faults between two adjacent product lines can be detected by NOR gate E2 combined with a parity counter as discussed in Theorem 4. Short faults between two adjacent output lines are not 100% detectable. However, in order to have a higher coverage for output short faults and multiple faults, the final signature can be shifted, rather than compressing the final signature into only one bit.

A new design of built-in self-test programmable logic arrays has been described. Deterministic test pattern generators which are an augmentation of the existing circuits are used to generate test patterns and the simplest multiple inputs signature registers are used to compact the test results. The final signature can be further compressed into only ONE bit. It is shown that all the single stuck-at and contact faults can be detected.

Various modifications will suggest themselves to those skilled in the art, without departing from the spirit and scope of this invention.

What is claimed is:

1. A programmable logic array (PLA) having built-in self-testing capability (BIST), said BIST PLA being capable of operating in a normal mode and a test mode, said BIST PLA comprising:

(a) a plurality of PLA input lines coupled with decoding circuits, said decoding circuits being coupled via a plurality of bit lines with an AND array, said AND array being coupled via a plurality of product lines with an OR array, said OR array being coupled with a plurality of OR array output lines, the aggregate of signals across said OR array output lines at an instant of time being an output signature;

(b) control signal receiver means for receiving a plurality of control signals from an external source, said control signals including a normal mode signal, a test mode signal, and a clock signal;

(c) bit-line test-pattern generation means coupled with said bit lines and said control signal receiver means and responsive to said control signals, for generating a first predetermined sequence of test patterns across said bit lines when in said test mode in synchronization with said clock signal;

(d) product-line test-pattern generation means coupled with said product lines and said control signal receiver means and responsive to said control signals, for generating a second predetermined sequence of test patterns across said product lines when in said test mode in synchronization with said clock signal;

(e) multiple output signature compression means coupled with said OR array output lines and said control signal receiver means and responsive to said control signals, for compressing the sequence of output signatures occurring in said test mode into a single-bit test result and for passing through unaltered any output signature occurring in said normal mode, said multiple output signature compression means having $X^Q+1$ as its characteristic polynomial where Q is the number of said OR Array output lines and X is a dummy variable;

(f) means coupled with said multiple output signature compression means for transmitting said single-bit test result to an external receiver; and (g) at least one PLA output line coupled with said multiple output signature compression means.

2. A BIST PLA as defined in claim 1 wherein a NOR gate is connected across said bit lines and said BIST PLA further includes means for transmitting the output of said NOR gate to said external receiver.

3. A BIST PLA as defined in claim 1 wherein a NOR gate is connected across said product lines and said BIST PLA further includes means for transmitting the output of said NOR gate to said external receiver.

4. A BIST PLA as defined in claim 1 wherein a first NOR gate is connected across said bit lines and a second NOR gate is connected across said product lines and said BIST PLA further includes means for transmitting the outputs of said first and second NOR gates to said external receiver.

* * * * *